US010268848B2

(12) United States Patent
Cocchini et al.

(10) Patent No.: US 10,268,848 B2
(45) Date of Patent: Apr. 23, 2019

(54) APPARATUS TO DETECT CABLE SEATING OR DISTURBANCE

(71) Applicant: INTERNATIONAL BUSINESS MACHINES CORPORATION, Armonk, NY (US)

(72) Inventors: Matteo Cocchini, Long Island City, NY (US); Robert K. Mullady, Highland, NY (US); Budy D. Notohardjono, Poughkeepsie, NY (US); Jacob T. Porter, Highland, NY (US); Kenneth Scea, Poughkeepsie, NY (US); Robert B. Schlak, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/782,979

(22) Filed: Oct. 13, 2017

(65) Prior Publication Data
US 2018/0336378 A1    Nov. 22, 2018

Related U.S. Application Data

(63) Continuation of application No. 15/599,652, filed on May 19, 2017.

(51) Int. Cl.
*G06K 7/08* (2006.01)
*H01R 13/66* (2006.01)
(Continued)

(52) U.S. Cl.
CPC ............ *G06K 7/081* (2013.01); *H01L 23/642* (2013.01); *H01R 13/6658* (2013.01); *B60N 2002/0264* (2013.01)

(58) Field of Classification Search
CPC .......... G06K 7/08; G06K 7/081; H01L 23/64; H01L 23/642; H01R 13/66;
(Continued)

(56) References Cited

U.S. PATENT DOCUMENTS

| 6,163,250 A | 12/2000 | Moskowitz |
| 8,414,326 B2 | 4/2013 | Bowman |

(Continued)

FOREIGN PATENT DOCUMENTS

| CN | 201657320 U | 11/2010 |
| JP | 3374594 B2 | 2/2003 |
| WO | 2009055091 A1 | 4/2009 |

OTHER PUBLICATIONS

Advanced Linear Devices, Inc., "Ultra Low Voltage Micropower Crystal Oscillator Circuit", Design Innovations in Analog Semiconductors, Circuit Ideas for Designers, Schematic No. fet_11120.0, © 2005, p. 1, http://www.aldinc.com/pdf/fet_11120.0.pdf.

(Continued)

*Primary Examiner* — Son T Le
(74) *Attorney, Agent, or Firm* — Richard A. Wilhelm (57) ABSTRACT

A displacement sensor that includes a stationary printed circuit board which includes a first capacitor pad, an indicator, and a battery electrically communicating with the first capacitor pad and the indicator and a sliding card which includes a second capacitor pad, the first capacitor pad and the second capacitor pad being orientated to face each other and in an overlapping relation to each other. An overlap being defined by the first capacitor pad and the second capacitor pad, wherein the overlap of the first capacitor pad and the second capacitor pad generates a capacitance, the generated capacitance changes as the sliding card moves as a result of a change in the overlap of the first capacitor pad and the second capacitor pad. The indicator is activated (Continued)

when the generated capacitance change reaches a threshold value.

1 Claim, 14 Drawing Sheets (51) Int. Cl.
*H01L 23/64* (2006.01)
*B60N 2/02* (2006.01)
*G01D 5/14* (2006.01)
*G06F 3/044* (2006.01)

(58) Field of Classification Search
CPC .... H01R 13/6658; B60N 2/02; B60N 2/0264; G01R 27/26; G01R 27/2605; G01R 31/016; G01R 31/312; G06F 3/044; G01D 5/14; G01D 5/145; G01D 5/24; G01B 7/044; G01B 7/14; G01B 7/08; H03K 17/955; H03K 17/975
See application file for complete search history.

(56) References Cited

U.S. PATENT DOCUMENTS

| | | |
|---|---|---|
| 9,051,769 B2 | 6/2015 | Washeleski et al. |
| 9,285,207 B2 | 3/2016 | Cagdaser et al. |
| 2004/0019258 A1 | 1/2004 | Kavounas et al. |
| 2009/0195364 A1 | 8/2009 | Edwards et al. |
| 2010/0207588 A1 | 8/2010 | Lowenthal et al. |
| 2015/0185049 A1 | 7/2015 | Baxter et al. |
| 2016/0259749 A1 | 9/2016 | Morrison et al. |
| 2017/0003459 A1 | 1/2017 | Takeuchi et al. |
| 2017/0127202 A1* | 5/2017 | Kim .............. H04R 29/001 |
| 2018/0136410 A1* | 5/2018 | Takeuchi .......... G02B 6/3895 |

OTHER PUBLICATIONS

Jensen, "Coin Cells and Peak Current Draw", White Paper SWRA349, Texas Instruments, © 2010, pp. 1-13.
Kang et al., "Electrode configuration method with surface profile effect in a contact-type area-varying capacitive displacement sensor", Sensors and Actuators A: Physical, vol. 189, (2013), pp. 33-44.
Maxim Integrated™, "MAX951-MAX954 Ultra-Low-Power, Single-Supply Op Amp + Comparator + Reference", Rev 3, Feb. 2015, pp. 1-13.
Farnell, "Murata GRM0335C1E100JD01D SMD Multilayer Ceramic Capacitor, 0201 [0603 Metric], 10 pF, 25 V, ± 0.5pF, C0G / NP0", printed on May 2, 2017, pp. 1-2, http://uk.farnell.com/murata/grm0335c1e100jd01d/cap-mlcc-c0g-np0-10pf-25v-0201/dp/1776028.
Wikipedia, the free encyclopedia, "Diode Bridge", https://en.wikipedia.org/wiki/Diode_bridge, printed on Feb. 7, 2017, pp. 1-6.
Murata, "PKMCS0909E4000-R1", Product Search Data Sheet, Feb. 8, 2017, pp. 1-3.
Pending U.S. Appl. No. 15/599,652, filed May 19, 2017, entitled: "Apparatus to Detect Cable Seating or Disturbance", pp. 1-31.
IBM: List of IBM Patents or Patent Applications Treated as Related (Appendix P), Oct. 27, 2017, pp. 1-2.

* cited by examiner

APPARATUS TO DETECT CABLE SEATING OR DISTURBANCE

BACKGROUND

The present invention relates generally to the field of displacement sensors, and more particularly to a capacitance based displacement sensor where the capacitance changes determines displacement notification.

Cable connections often become unseated or partial disengaged. For example, partial disengagement of the primary contact element(s) can cause failures or errors. An unseated or partially disengaged connection condition can lead to an interference in the transmission of signals. Such a condition may be seen or diagnosed as an intermittent behavior or errors, or a complete failure in the device. Various mechanisms can contribute to unseating, such as: operator inadvertent disruption, operational vibration, poor mechanical engagement and/or mechanical interference. This is a common problem in scalable computing hardware, mainframe computers, and small computer hardware. Field and manufacturing issues can be caused by an unseated connector or cable. An unseated connector or cable can result in a link degrade or link down condition, for example, the connection or cable can become fully disengaged from its connection. Additionally, the cable and connector are dense and have substantial mass, which can put added strain on the connection. Sometimes this strain can cause a displacement, for example, loose plug or cables are moved and become completely or partially displaced from their connection. One problem with completely or partially displaced connections is that it is not easy to detect visually. Often the solution is to reconnect all the card and cable connections in the link path which can be time consuming, and labor intensive, in addition to causing down time for devices.

BRIEF SUMMARY

Additional aspects and/or advantages will be set forth in part in the description which follows and, in part, will be apparent from the description, or may be learned by practice of the invention.

Embodiments of the present invention disclose a displacement sensor attached to an apparatus. The displacement sensor includes a stationary printed circuit board which includes a first capacitor pad, an indicator, and a battery electrically communicating with the first capacitor pad and the indicator and a sliding card which includes a second capacitor pad, the first capacitor pad and the second capacitor pad being orientated to face each other and in an overlapping relation to each other. An overlap being defined by the first capacitor pad and the second capacitor pad, wherein the overlap of the first capacitor pad and the second capacitor pad generates a capacitance, the generated capacitance changes as the sliding card moves as a result of a change in the overlap of the first capacitor pad and the second capacitor pad. The indicator is activated when the generated capacitance change reaches a threshold value in response to the change in the overlap of the first capacitor pad and the second capacitor pad, and wherein the activated indicator indicates the apparatus has been displaced from a connection.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

Reference will now be made in detail to the embodiments of the present invention, examples of which are illustrated in the accompanying drawings, wherein like reference numerals refer to like elements throughout. Embodiments of the invention are generally directed to a displacement sensor. The displacement sensor contains a sliding card that interacts with a printed circuit board (PCB), such that as the two of them overlap a capacitance charge is formed. The larger the overlap the higher the charged. As the sliding arm moves the capacitance changes, thus the displacement sensor determines if the item is loose, displaced, or disconnected.

Figure 1A:
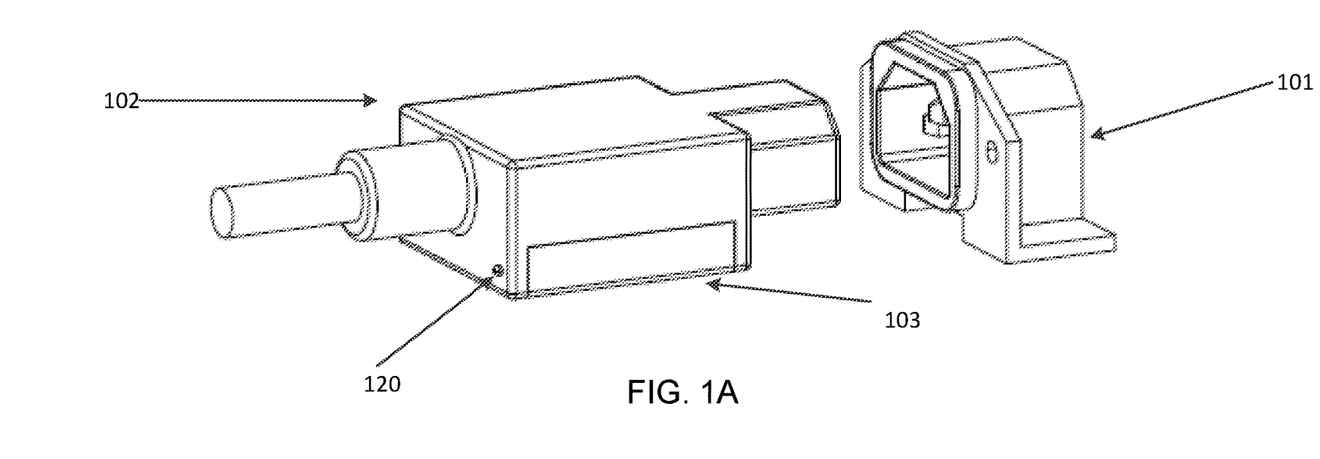
FIGS. 1A and 1B illustrate an embodiment of a displacement sensor, in accordance with an embodiment of the present invention.
Figure 1B:
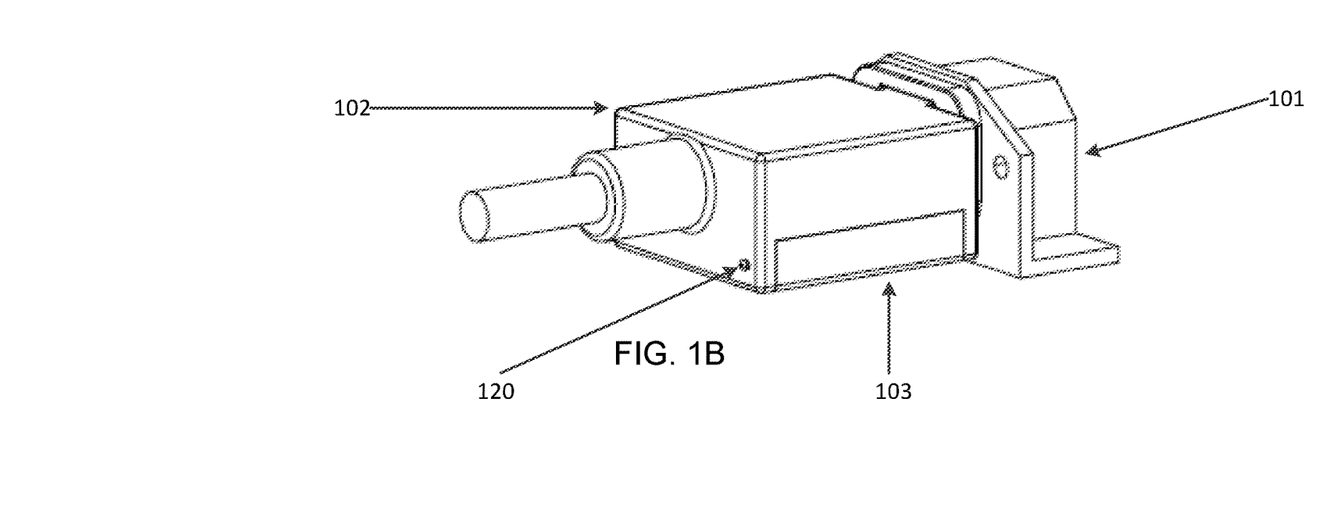
Figure 2:
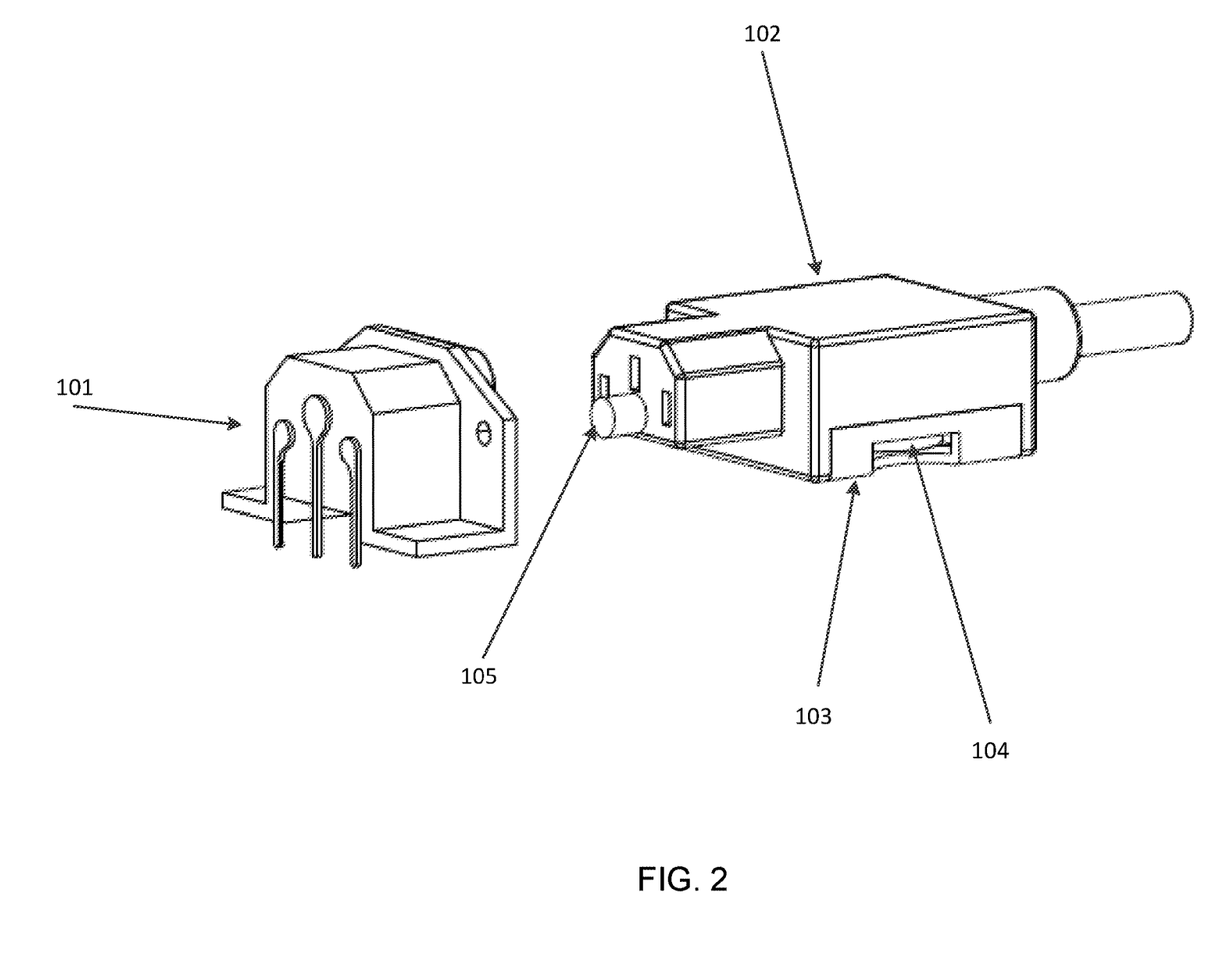
FIG. 2 illustrates another view of the embodiment of the displacement sensor shown in FIGS. 1A and 1B.

FIGS. 1A and 1B illustrate an embodiment of the displacement sensor 103, in accordance with an embodiment of the present invention. The displacement sensor 103 is mounted on a plug 102 that can be inserted into an outlet 101. FIG. 2 illustrates another view of an embodiment of the displacement sensor 103, in accordance with an embodiment of the present invention. FIG. 2 shows a different view point of the plug 102 and the outlet 101. FIG. 2, illustrates that the displacement sensor 103 contains a battery 104 and plunger 105.

Figure 3A:
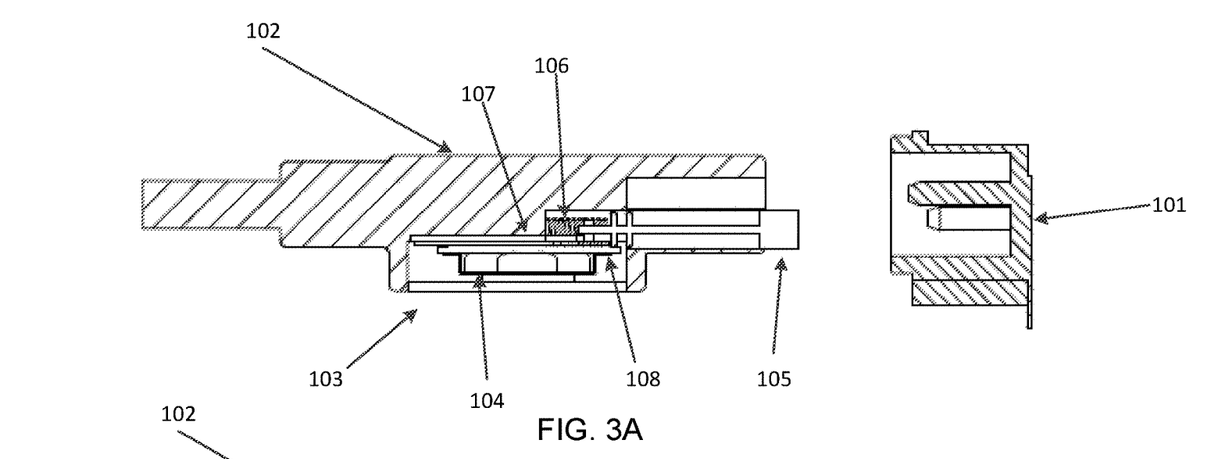
FIGS. 3A and 3B illustrate a cross section of the embodiment of the displacement sensor shown in FIGS. 1A and 1B.
Figure 3B:
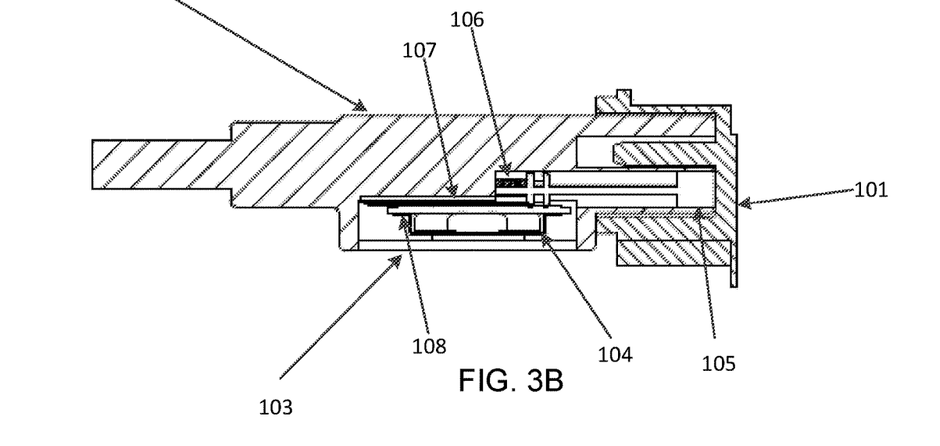

FIGS. 3A and 3B illustrates a cross section of an embodiment of the displacement sensor 103, in accordance with an embodiment of the present invention. FIGS. 3A and 3B illustrates a cross section of the outlet 101, the plug 102 and the displacement sensor 103. The displacement sensor 103 includes the battery 104, the plunger 105, a spring 106, a sliding card 107, a printed circuit board 108, and an indicator 120. As illustrated by FIG. 3A, when the plug 102 is not engaged with the outlet 101 the plunger 105 of the displacement sensor 103 extends from the plug 102. When the plug 101 engages with the outlet 101, then the plunger 105 moves to a position contained within the plug 102 causing the spring 106 to be compressed. As the plunger 105 moves in a direction, it causes the sliding card 107 to move in the same direction as the plunger 105. The sliding card 107 is attached, mounted, or formed integrally with the plunger 105, so that when the plunger 105 extends from the plug 102 then the sliding card 107 moves in a first direction, and when the plunger 105 is compressed within the plug 102 then the sliding card 107 moves in a second direction opposite of the first direction. The sliding card 107 moves in a parallel direction with the movement of the plunger 105.

FIG. 3A detects the plug 102 unseated from the outlet 101. The plunger 105 is displaced when in a seated position shown in FIG. 3B. The displacement causes the plunger 105 and sliding card 107 to move, thus changing the generated capacitance of the two parallel capacitor pads 115 and 118.

Figure 4:
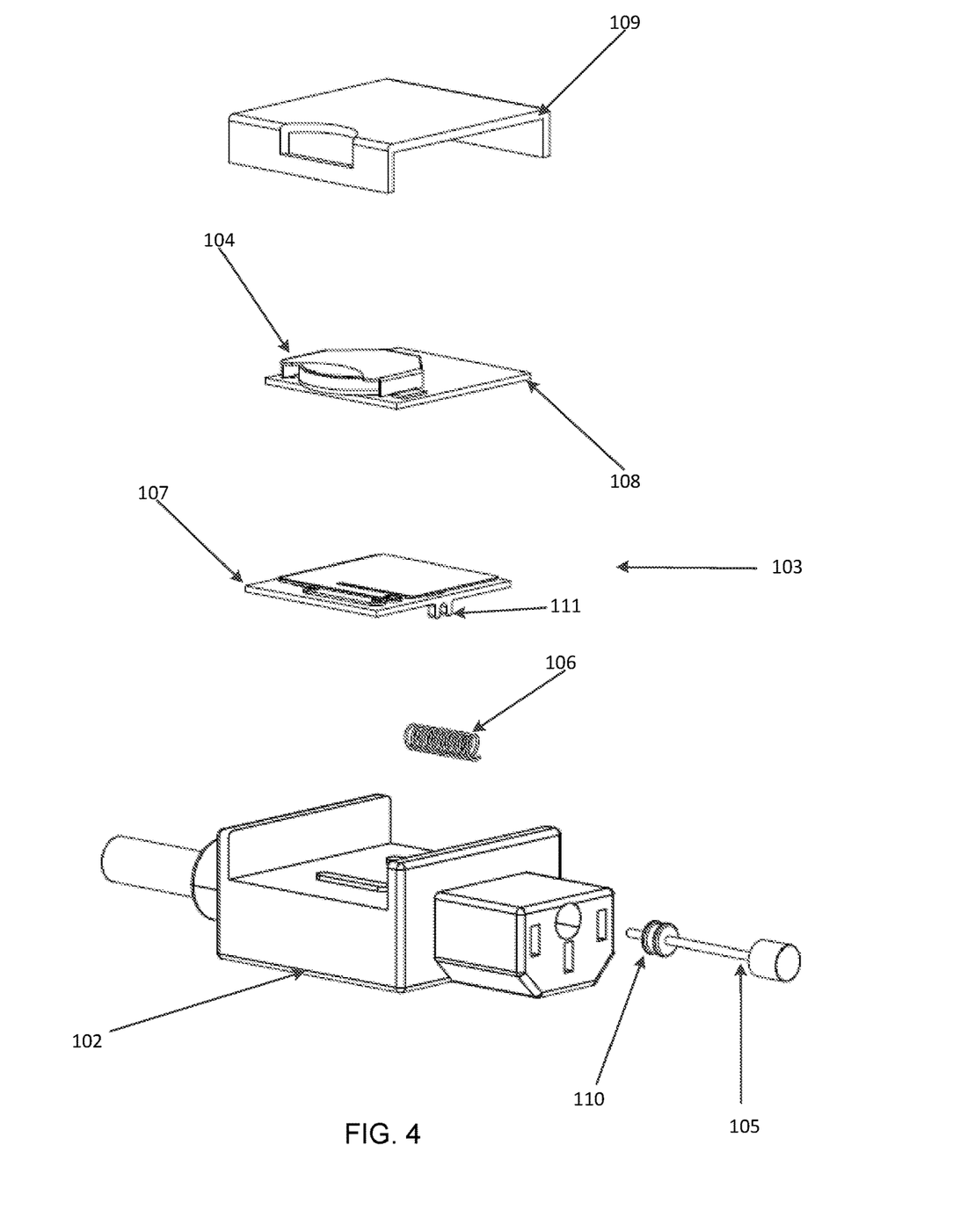
FIG. 4 illustrates an expanded view of the embodiment of the displacement sensor shown in FIGS. 1A and 1B.
Figure 5:
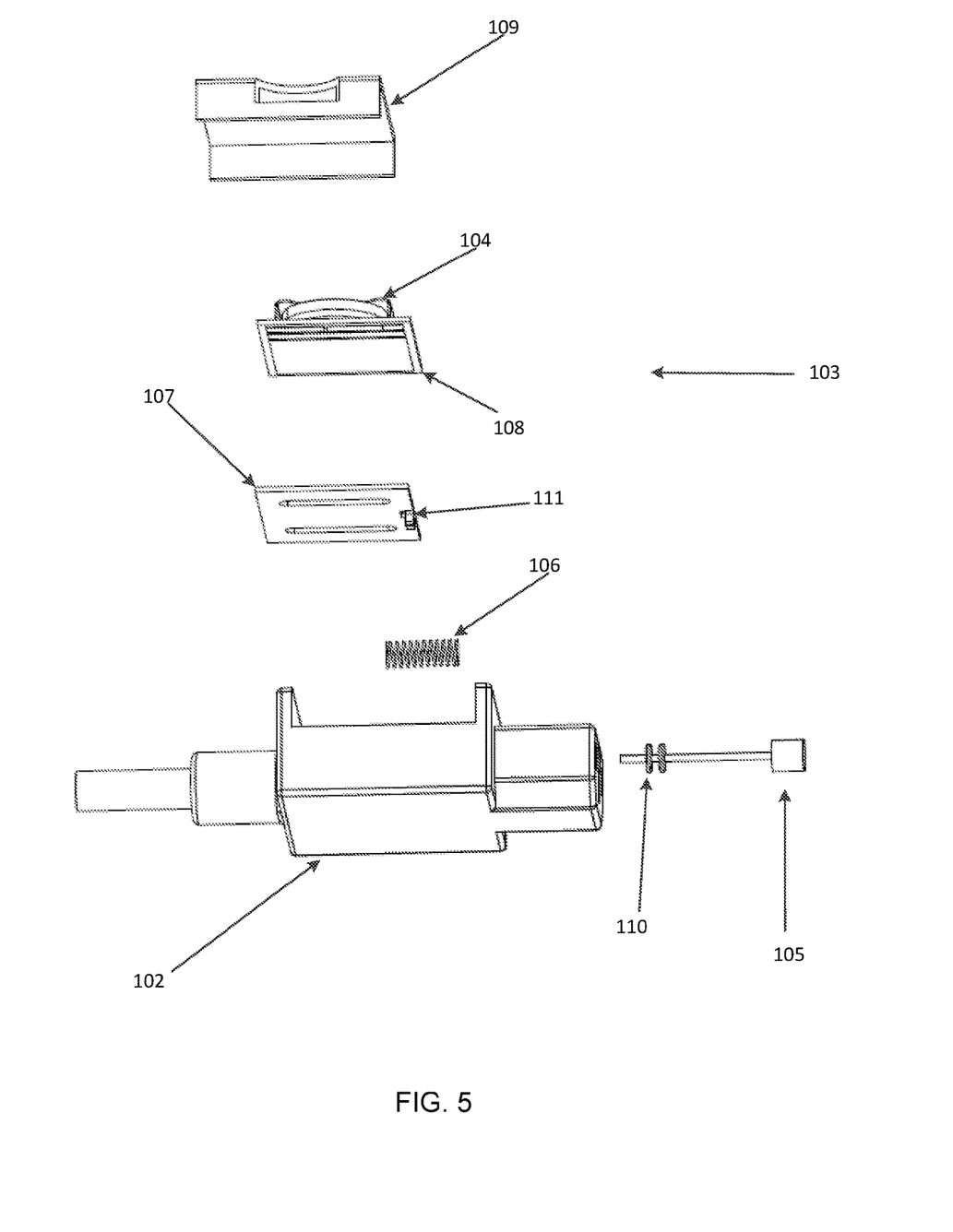
FIG. 5 illustrates an expanded view of the embodiment of the displacement sensor shown in FIGS. 1A and 1B.

FIG. 4 illustrates an expanded view of an embodiment of the displacement sensor 103, in accordance with an embodiment of the present invention. FIG. 5 illustrates an expanded view of an embodiment of the displacement sensor 103, in accordance with an embodiment of the present invention. FIGS. 4 and 5 illustrate an exploded view of the plug 102 and the displacement sensor 103 showing the different components of the displacement sensor 103. The displacement sensor 103 further includes a cover 109. The sliding card 107 includes a mounting fixture 111 that connects to the mounting point 110 of the plunger 105.

Figure 6:
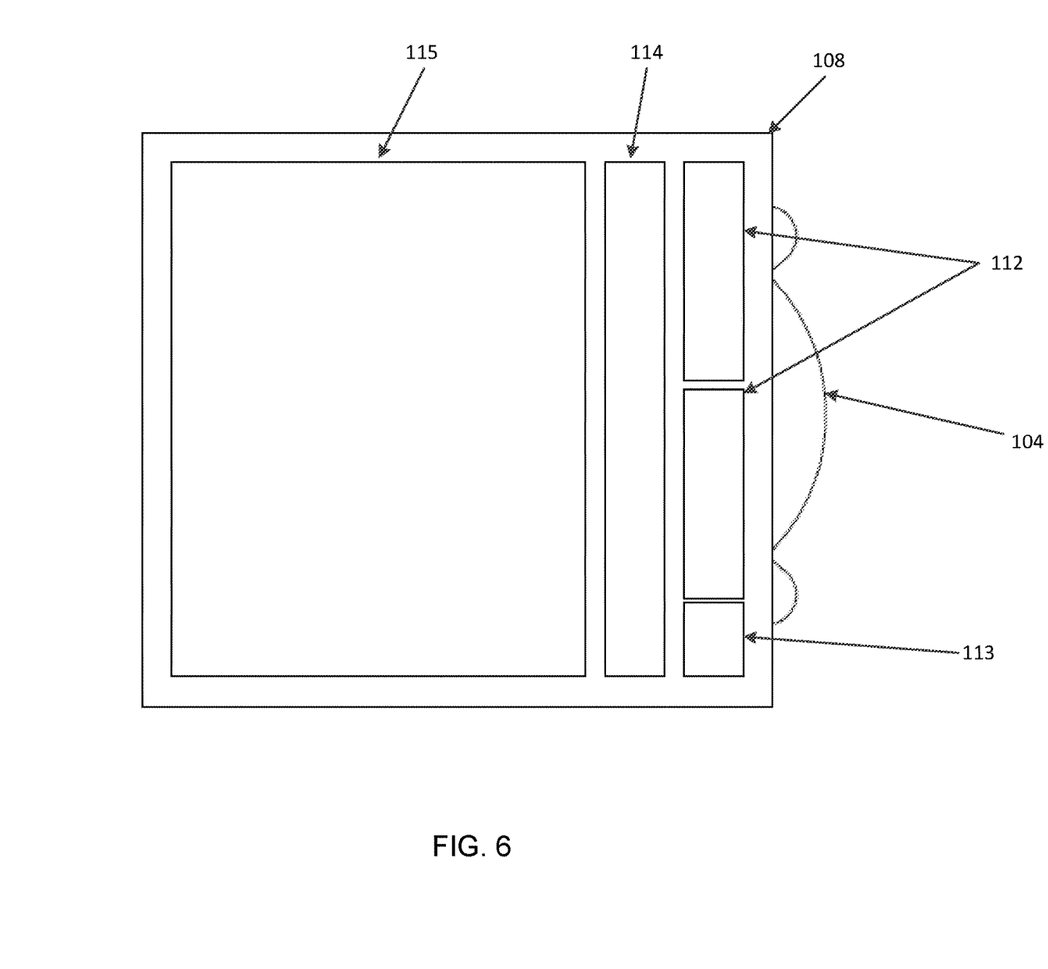
FIG. 6 illustrates a printed circuit board (PCB) of the embodiment of the displacement sensor shown in FIGS. 1A and 1B.

FIG. 6 illustrates a printed circuit board (PCB) 108 of an embodiment of the displacement sensor 103, in accordance with an embodiment of the present invention. The PCB 108 includes the battery 104 on one side and on the other side the PCB 108. The side of the PCB 108 that faces the sliding card 107, includes power jumper pads 112, an inactive pad 113, a connection 114 to the slider card 107, and a capacitor pad 115. The capacitor pad 115 is shown as being a square shape, but it is not limited to that shape. The capacitor pad 115 can take the shape of a rectangular, "E" shaped, or any other type of shape as long as the surface area is known. Furthermore, the capacitor pad 118 of the sliding card 107 mirrors the shape of the capacitor pad 115 of the PCB 108, so the overlap area of capacitor pads 115 and 118 is known.

Figure 7A:
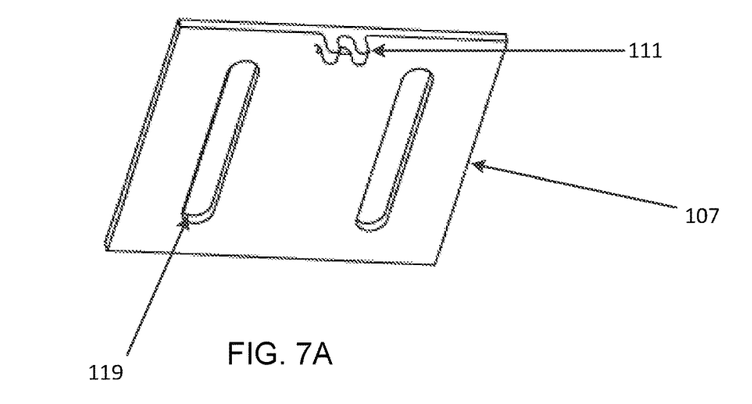
FIGS. 7A, 7B, 7C illustrate different views of a slider card of the embodiment of the displacement sensor shown in FIGS. 1A and 1B.
Figure 7B:
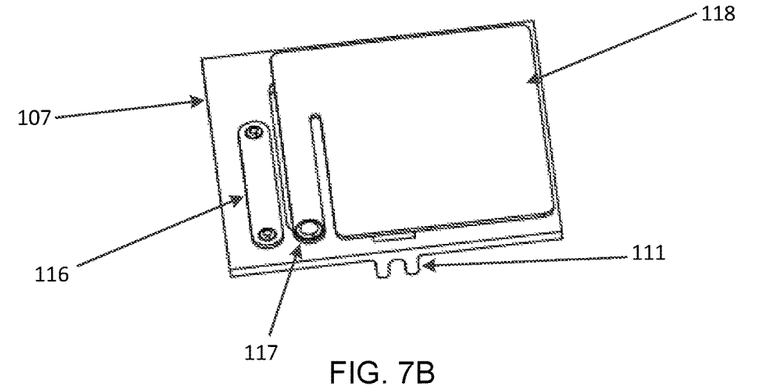
Figure 7C:
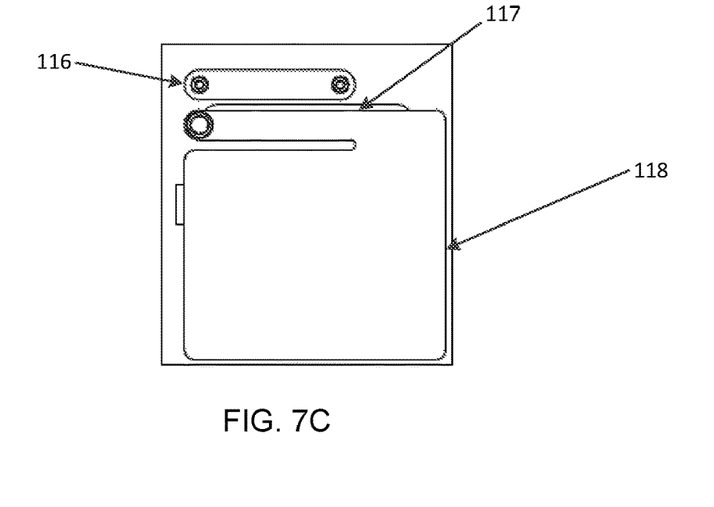

FIGS. 7A, 7B, 7C illustrate different views of the slider card 107 of an embodiment of the displacement sensor 103, in accordance with an embodiment of the present invention. The sliding card 107 includes on side the does not face the PCB 108, the mounting fixture 111 and slide tracks 119, which guide the sliding movement of the sliding card 107. The sliding card 107 includes on the side the faces the PCB 108, a power jump 116, a contact 117 to the PCB 108, and a capacitor pad 118. The capacitor pad 118 is shown as being a square shape, but it is not limited to that shape. The capacitor pad 118 can take the shape of a rectangular, "E" shaped, or any other type of shape as long as the surface area is known. Furthermore, the capacitor pad 115 of the PCB 108 mirrors the shape of the capacitor pad 118 of the sliding card 107, so the overlap area of capacitor pads 115 and 118 is known. Therefore, as the sliding card 107 moves it causes the overlap area of capacitor pads 118 and 115 to change, thus causing the capacitance to change. When the plug 102 is fully seated within outlet 101 then the capacitors pads 115 and 118 fully overlap. As the plug 102 is moving out, or displaced, from outlet 101, the plunger 105 moves causing the sliding card 107 to move, thus the overlap of the capacitors pads 115 and 118 changes with the movement of the sliding card 107. Once the capacitance, which is generated by the overlap, reaches a threshold value it causes the indicator 120 to activate. The indicator 120 can be, for example, a light emitting diode (LED), a plurality of LEDs to indicate a degree of displacement, any other type of visual indicator, or it can be an acoustic indicator.

Figure 8:
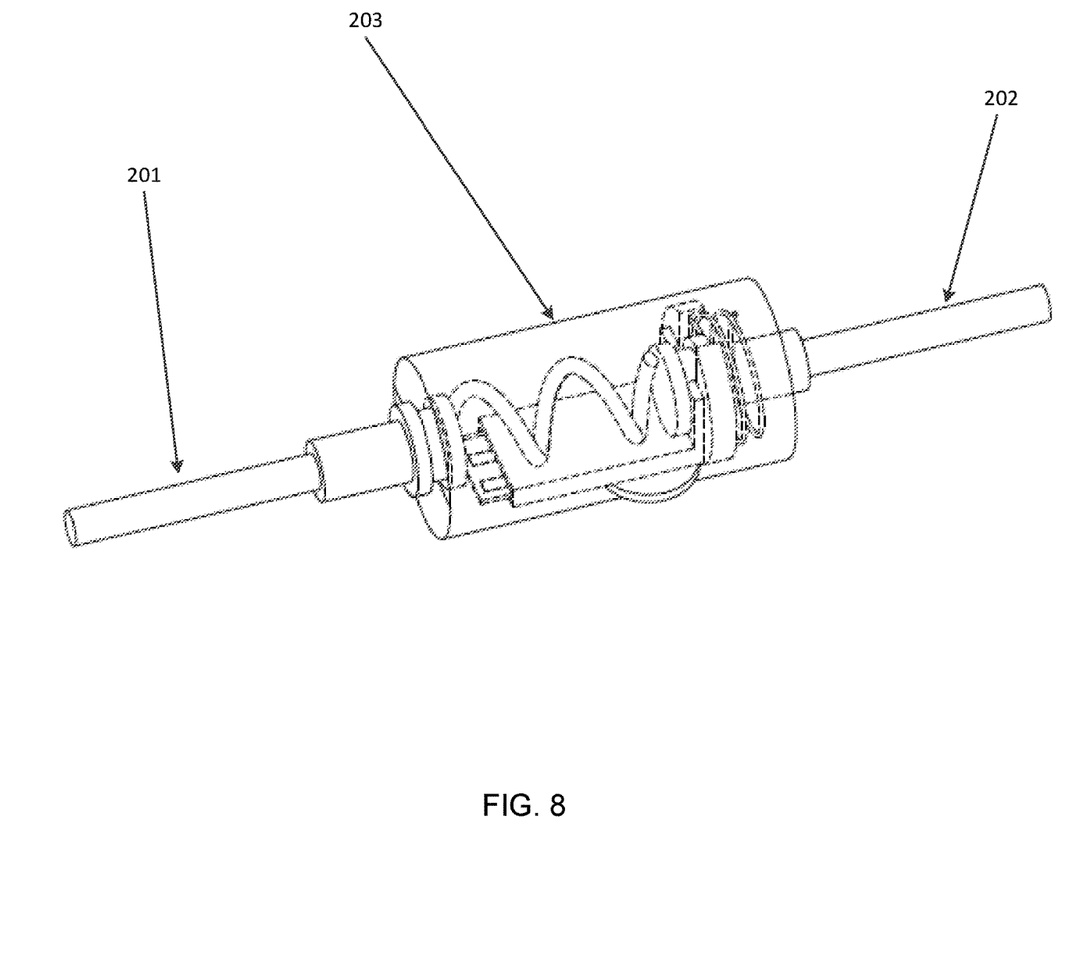
FIG. 8 illustrates a second embodiment of the displacement sensor, in accordance with an embodiment of the present invention.

FIG. 8 illustrates an embodiment of the displacement sensor 203, in accordance with an embodiment of the present invention. The displacement sensor 203 can be used the displacement of a cable, such that the displacement sensor 203 is connected between a stationary cable 201 and a movable cable 202. The displacement sensor 203 can be connected to either a female or male end of either the stationary cable 201 and/or the movable cable 202.

Figure 9:
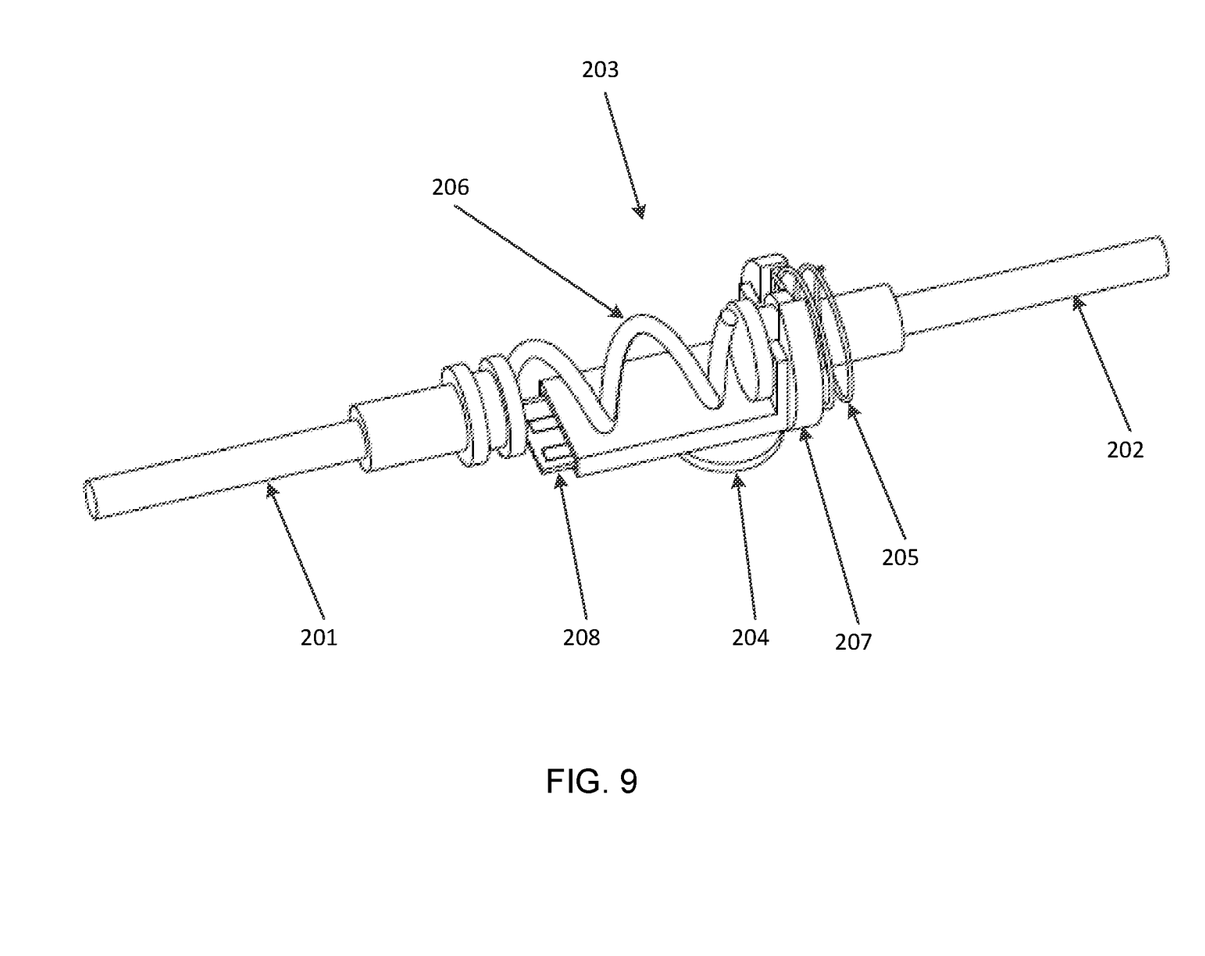
FIG. 9 illustrates the second embodiment of the displacement sensor as shown in FIG. 8.
Figure 10:
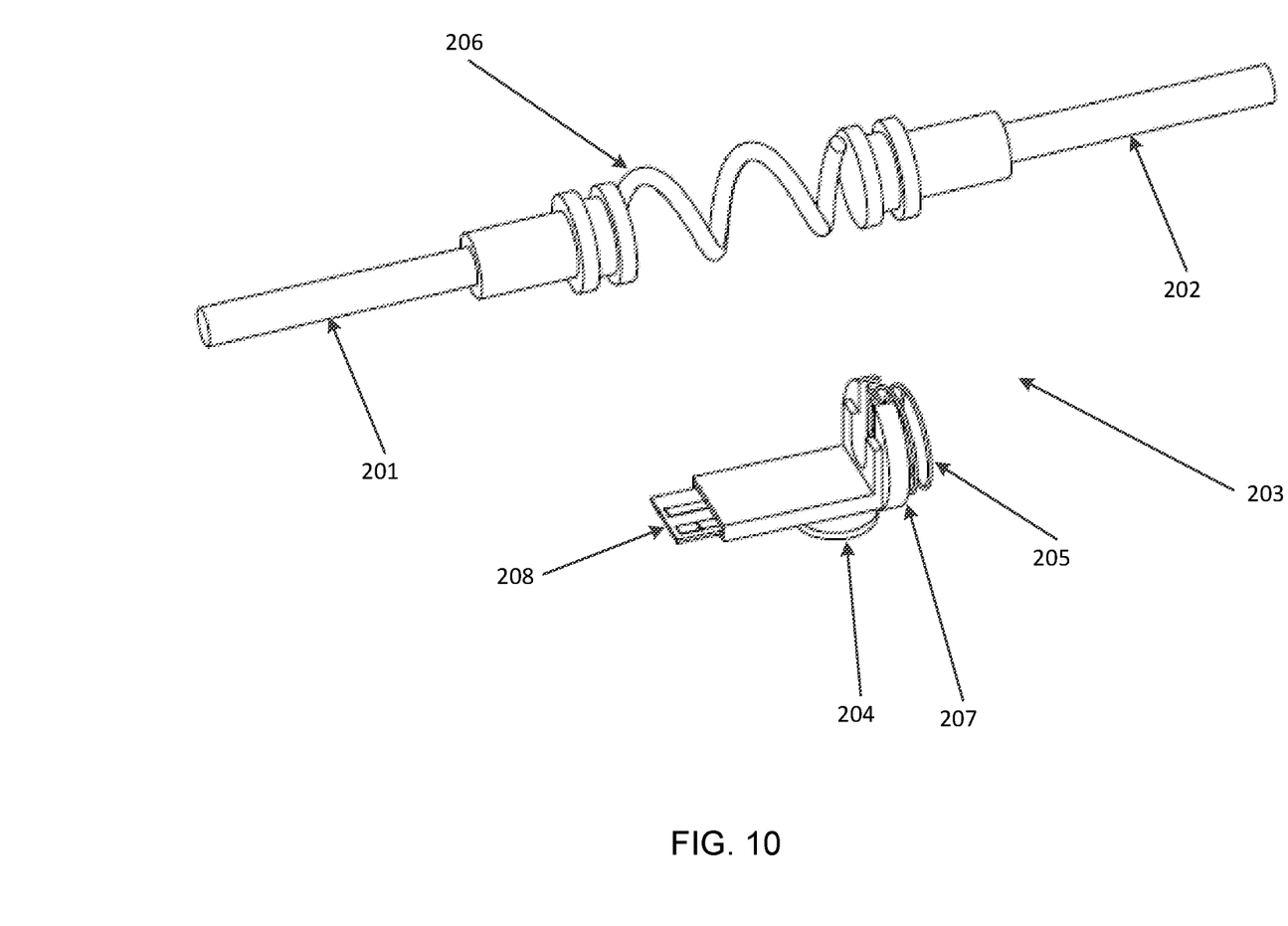
FIG. 10 illustrates a printed circuit board (PCB) of the second embodiment of the displacement sensor, as shown in FIG. 8.

FIG. 9 illustrates an embodiment of the displacement sensor 203, in accordance with an embodiment of the present invention. FIG. 10 illustrates an expanded view of an embodiment of the displacement sensor 203, in accordance with an embodiment of the present invention. The displacement sensor 203 is connected to a stationary cable 201 and a movable cable 202, while the displacement sensor 203 includes a spring 205 for loading the movable cable 202, a battery 204, a coiled cable 206, a sliding card 207, and a printed circuit board (PCB) 208. Spring 205 allows for the movable cable to be mounted to the sliding card 207 of the displacement sensor. The coiled cable 206 allows for the sliding card 207 to move, while the PCB 208 remains stationary. The sliding card 207 and the PCB 208 acts interact with each other in the same fashion as sliding card 107 and PCB 108, as described above.

Figure 11:
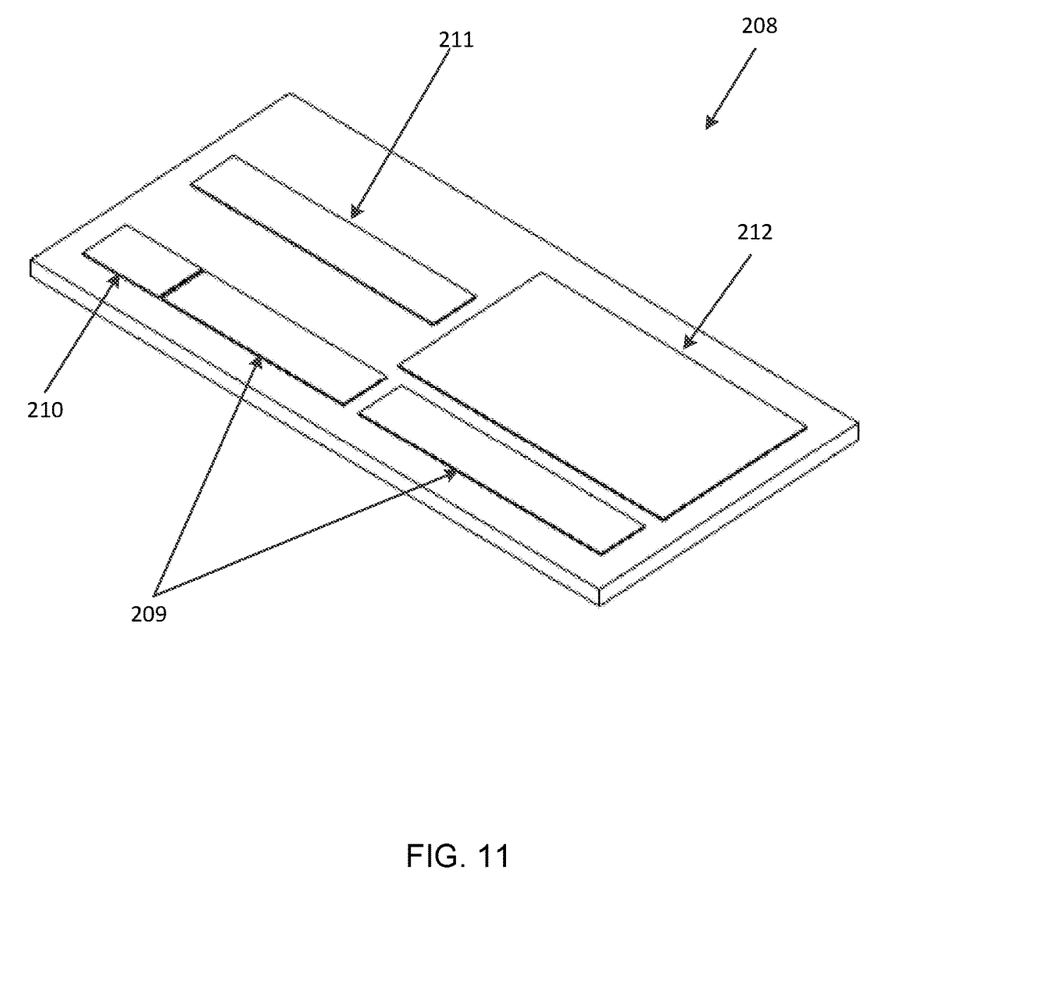
FIG. 11 illustrates an expanded view of the second embodiment of the displacement sensor, as shown in FIG. 8.

FIG. 11 illustrates a printed circuit board (PCB) 208 of an embodiment of the displacement sensor, in accordance with an embodiment of the present invention. The PCB 208 includes the battery 204 on one side and on the other side the PCB 208, the side that faces the sliding card 207, includes power jumper pads 209, an inactive pad 210, a connection 211 to the slider card 207, and a capacitor pad 212. The capacitor pad 212 is shown as being a rectangle shape, but it is not limited to that shape. The capacitor pad 115 can take the shape of a square, "E" shaped, or any other type of shape as long as the surface area is known and that the capacitor pad 216 of the sliding card 207 mirrors the shape of the capacitor pad 212 of the PCB 208.

FIG. 9 detects a disturbance of the stationary cable 201 and the movable cable 202. The force on the movable cable 202, i.e. the cable is being pulled, disturbed, or generally moved, wherein the movable cable 202 is connected to the sliding card 207 such that as the movable cable 202 position changes then the position of the sliding card 207 changes. As the sliding card 207 changes positions then the orientation of the two capacitor pads 212 and 216, thus changing the generated capacitance of the two parallel capacitor pads 212 and 216. The displacement sensor 203 detects the force that is exerted on the movable cable 202 and if the force removed then the displacement sensor 203 returns to its original state.

Figure 12A:
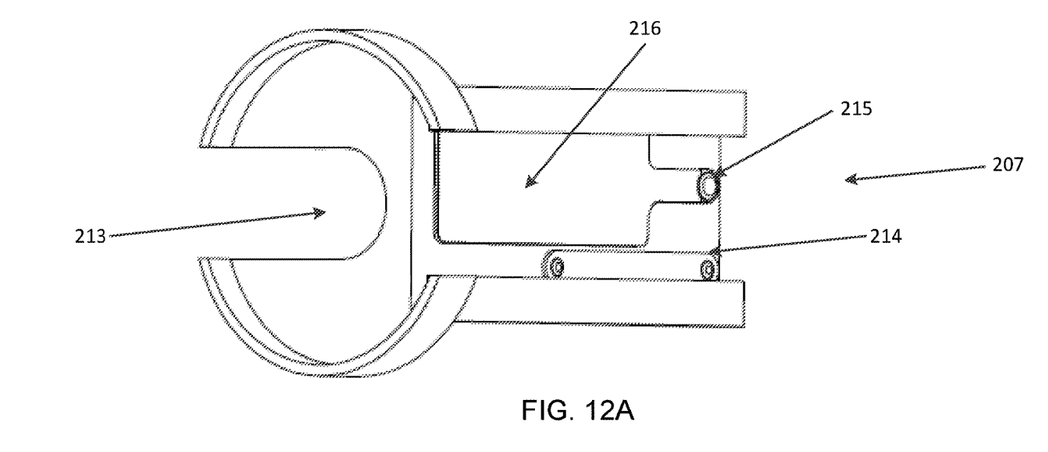
FIGS. 12A and 12B illustrate different views of the slider card of the second embodiment of the displacement sensor, as shown in FIG. 8.
Figure 12B:
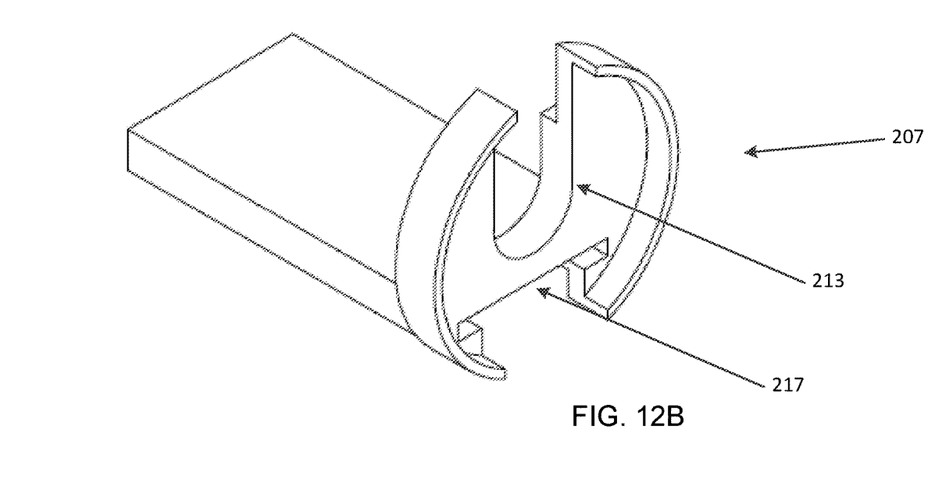

FIGS. 12A and 12B illustrates different views of the slider card of an embodiment of the displacement sensor, in accordance with an embodiment of the present invention.

The sliding card 207 includes a mounting fixture 213 for connecting to movable cable 202 and a slide tracks 217 which guide the sliding movement of the sliding card 207 over the PCB 208. The sliding card 207 includes on side the faces the PCB 208, a power jump 214, a contact 215 to the PCB 208, and a capacitor pad 216. The capacitor pad 216 is shown as being a rectangular shape, but it is not limited to that shape. The capacitor pad 216 can take the shape of a square, "E" shaped, or any other type of shape as long as the surface area is known and that the capacitor pad 212 of the PCB 208 mirrors the shape of the capacitor pad 216 of the sliding card 207. Therefore, as the sliding card 207 moves it causes the overlap area of capacitor pads 212 and 216 to change, thus causing the capacitance to change. When the movable cable 202 is in a proper position, then the capacitors pads 212 and 216 fully overlap. As the movable cable 202 is moving out, displaced, changes positions, then the coiled cable 206 and spring 205 causes the sliding card 207 to move, thus the overlap of the capacitors pads 212 and 216 changes with the movement of the sliding card 207. Once the capacitance, which is generated by the overlap, reaches a threshold value it causes the indicator (220) to activate. The indicator can be, for example, a light emitting diode (LED), a plurality of LEDs to indicate a degree of displacement, any other type of visual indicator, or it can be an acoustic indicator.

Figure 13:
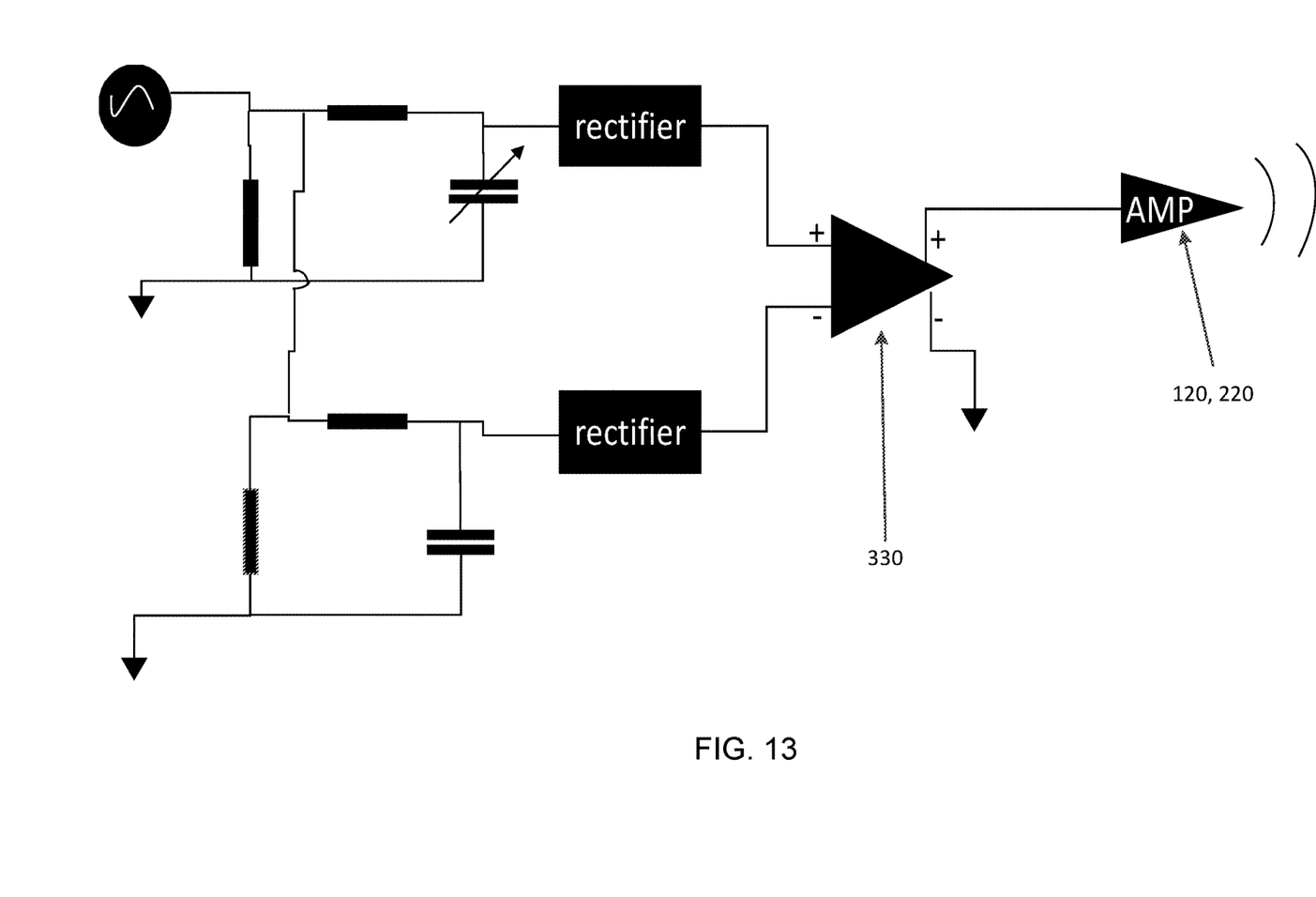
FIG. 13 illustrates an exemplary circuit diagram for an embodiment of the displacement sensor, in accordance with an embodiment of the present invention.

FIG. 13 illustrates an exemplary circuit diagram for an embodiment of the displacement sensor 103 and 203, in accordance with an embodiment of the present invention. The exemplary circuit diagram shows indicators 120, 220 and a comparator 330. The comparator 330 compares the calculated capacitance with the threshold value to determine if the indicators 120, 220 should be activated.

Figure 14:
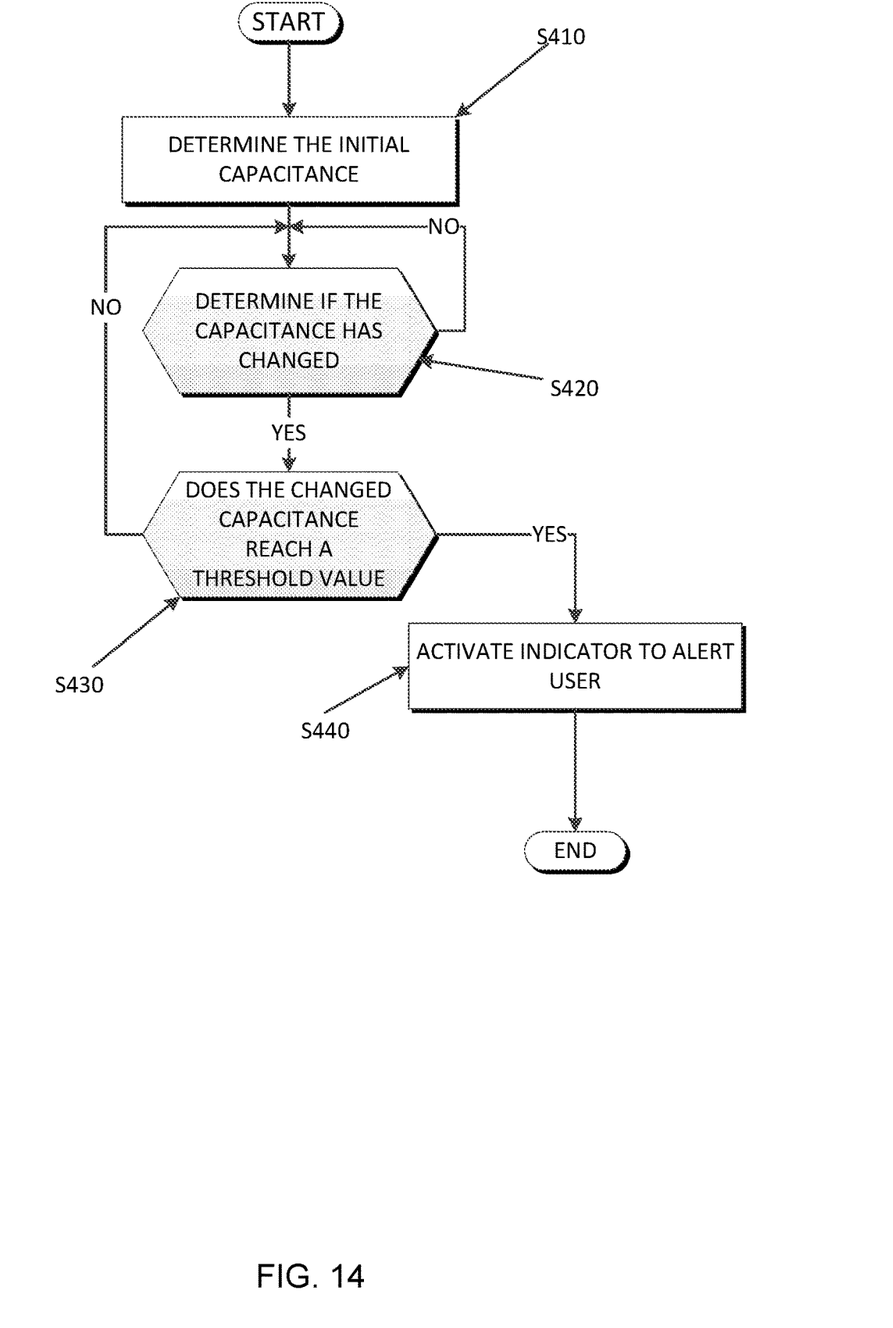
FIG. 14 is a flowchart depicting operational steps of the displacement sensor, in accordance with an embodiment of the present invention.

FIG. 14 is a flowchart depicting operational steps of the displacement sensor, in accordance with an embodiment of the present invention.

The displacement sensor 103, 203 determines the initial capacitance (S410). The displacement sensor 103, 203 determines if the capacitance has changed (S420). When there is no change, then the displacement sensor 103, 203 does not react. When the sliding cards 107, 207 changes positions it causes the overlap of capacitor pads 115, 118, 212 and 216 to change, thus causing the capacitance to change. When the displacement sensor 103, 203 determined the capacitance has changed, then the comparator 330 determines if the capacitance has reached a threshold value (S430). When the capacitance has not reached the threshold value, then the displacement sensor 103, 203 waits to see if the capacitance changes any further (S420). When the capacitances reaches the threshold value, then the indicators 120, 220 is activated to alert a user that the plug 102 or a cable 201, 202 have become displaced (S440).

Numerous modifications and substitutions can be made without deviating from the scope of the present invention. Therefore, the present invention has been disclosed by way of example and not limitation.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A plug comprising:
a plug end that includes a connector to connect to a socket,
   a cavity to house a displacement sensor, and a cavity to hold a plunger;
wherein the displacement sensor comprises:
   a stationary printed circuit board which includes a first capacitor pad, an acoustic indicator, and a battery electrically communicating with the first capacitor pad and the acoustic indicator, wherein the first capacitor pad is E shaped;
   a sliding card that is connected to the plunger, wherein the sliding card includes a second capacitor pad, the first capacitor pad and the second capacitor pad being orientated to face each other and in an overlapping relation to each other, wherein the second capacitor pad is E shaped that is the mirror of the first capacitor pad;
   a spring that biases the movement of the plunger, wherein as the plug is inserted to the socket which causes to the plunger to move in a first direction and when the plug is being displaced from the socket the plunger moves in a second direction opposite of the first direction, wherein the movement of the plunger in the first direction or the second direction causes the sliding card to move in the same direction;
   an overlap being defined by the first capacitor pad and the second capacitor pad, wherein the overlap of the first capacitor pad and the second capacitor pad generates a capacitance, the generated capacitance changes as the sliding card moves as a result of a change in the overlap of the first capacitor pad and the second capacitor pad;
   wherein the acoustic indicator is activated when the generated capacitance change reaches a threshold value in response to the change in the overlap of the first capacitor pad and the second capacitor pad, and wherein the activated the acoustic indicator indicates the plug has been displaced from a connection.

* * * * *